(12) United States Patent
Lim et al.

(10) Patent No.: US 8,159,589 B2
(45) Date of Patent: Apr. 17, 2012

(54) IMAGE SENSOR FOR HIGH-SPEED DATA READOUT

(75) Inventors: Seung Hyun Lim, Seoul (KR); Gun Hee Han, Gyeonggi-do (KR); Seog Heon Ham, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 458 days.

(21) Appl. No.: 12/427,214

(22) Filed: Apr. 21, 2009

(65) Prior Publication Data

US 2009/0262229 A1 Oct. 22, 2009

(30) Foreign Application Priority Data

Apr. 21, 2008 (KR) ........................ 10-2008-0036585

(51) Int. Cl.
*H04N 5/335* (2006.01)
(52) U.S. Cl. ........ 348/311; 348/294; 348/302; 348/308; 348/573
(58) Field of Classification Search .................. 348/311, 348/294, 302, 308, 573
See application file for complete search history.

(56) References Cited

U.S. PATENT DOCUMENTS

| 7,488,928 B2 * | 2/2009 | Krymski .................... 250/208.1 |
| 2002/0036940 A1 | 3/2002 | Uchikoba et al. |
| 2005/0174452 A1 * | 8/2005 | Blerkom et al. .............. 348/294 |

FOREIGN PATENT DOCUMENTS

| JP | 06-068666 | 3/1994 |
| KR | 1019990030080 A | 4/1999 |
| KR | 1020010059962 A | 7/2001 |

* cited by examiner

*Primary Examiner* — Evelyn A. Lester
(74) *Attorney, Agent, or Firm* — Myers Bigel Sibley & Sajovec, P.A.

(57) ABSTRACT

An image sensor for high-speed data readout is provided. The image sensor includes a line memory block temporarily storing a digital signal in unit of lines which is generated based on an analog signal output from a pixel array. The line memory block includes a plurality of line memories, a plurality of data line pairs respectively connecting the line memories to a sense amplifying unit, and a plurality of data line prechargers each including at least two precharge units separately connected with a corresponding one of the data line pairs to precharge the corresponding data line pair with a predetermined precharge voltage. Accordingly, the image sensor performs high-speed digital signal readout based on precharge operation of the data line prechargers.

15 Claims, 7 Drawing Sheets

IMAGE SENSOR FOR HIGH-SPEED DATA READOUT

CROSS-REFERENCE TO RELATED APPLICATIONS

This application claims priority from Korean Patent Application No. 10-2008-0036585 filed on Apr. 21, 2008, in the Korean Intellectual Property Office, the disclosure of which is incorporated herein by reference in its entirety.

FIELD OF THE INVENTION

The present invention relates to the field of electronics, and more particularly, to image sensors.

BACKGROUND

An image sensor can be a semiconductor device that produces an electrical signal in response to incoming light. An image sensor can be, for example, a charge coupled device (CCD) or a complementary metal oxide silicon (CMOS) image sensor. A CCD can be complicated in operation and manufacturing and may have relatively large power consumption. Recently, CMOS image sensors have been used in various products such as digital cameras, camcorders, personal communication systems (PCS), and game machines.

An image sensor usually includes a pixel array, an analog-to-digital converter (ADC), a line memory, and a sense amplifier. The pixel array can include several tens of thousand to several millions of pixels arranged in a matrix. Each pixel in the array includes a photo sensitive device which senses incoming light. The photo sensitive device can convert incoming photons into electron-hole pairs, which can accumulate in the photosensitive device as charges. The amount of accumulated charge can vary depending on the intensity and the amount of incoming light. Each pixel measures associated accumulated charge and outputs an electrical analog signal.

The ADC can convert the electrical analog signal output from the pixel array into a digital signal. The digital signal can be temporarily stored in the line memory. The sense amplifier can amplify the digital signal transmitted from the line memory.

The operating speed of an image sensor can be directly related to the digital signal readout speed, which may depend on the time needed for the digital signal stored in the line memory to be transmitted to the sense amplifier (via the bus line), amplified and then output by the sense amplifier. When the time taken for this process decreases, the operating speed of the image sensor can be increased. One of the aspects influencing the speed at which the digital signal can be generated is the parasitic resistance and capacitance associated with the bus line. In other words, the digital signal readout speed may be affected by parasitic resistance and capacitance of the bus line.

SUMMARY

According to some embodiments of the present invention, there is provided an image sensor including a pixel array, an analog-to-digital converter, a line memory block, and sense amplifying unit. The pixel array includes a plurality of pixels each outputting an analog signal corresponding to the amount of light. The an analog-to-digital converter converts an analog signal output in units of lines from the pixel array into an N-bit digital signal where N is 2 or a natural number greater than 2. The line memory block temporarily stores the digital signal in unit of lines. The sense amplifying unit senses and amplifies a signal output from the line memory block.

The line memory block may include first through N-th line memories each comprising a plurality of memory cells each of which stores a corresponding bit signal in a digital signal of a corresponding pixel among the plurality of pixels; first through N-th data line pairs configured to respectively connect the first through N-th line memories to the sense amplifying unit; and first through N-th data line precharger each comprising at least two precharge units separately connected with a corresponding one of the first through N-th data line pairs to precharge the corresponding data line pair with a predetermined precharge voltage.

Each of the first through N-th data line pairs may be disposed between a corresponding one of the first through N-th line memories and another one thereof. Alternatively, the first through N-th data line pairs may be disposed between a group of some of the first through N-th line memories and a group of the others.

Each of the precharge units may be disposed at an allocated area below a corresponding data line pair among the first through N-th data line pairs or may be disposed at an area allocated below the first through N-th data line pairs regardless of the corresponding data line pair. Each precharge unit may be connected between the corresponding data line pair and a line for supplying the precharge voltage and include a plurality of switches operating in response to a precharge enable signal.

According to other embodiments of the present invention, there is provided an image sensor including a pixel array, an analog-to-digital converter, a line memory block, and sense amplifying unit. The pixel array includes a plurality of pixels each outputting an analog signal corresponding to the amount of light. The analog-to-digital converter converts an analog signal output in units of lines from the pixel array into an N-bit digital signal where N is 2 or a natural number greater than 2. The line memory block temporarily stores the digital signal in unit of lines. The sense amplifying unit senses and amplifies a signal output from the line memory block.

The line memory block may included a plurality of memory cells, a data line pair connected with the plurality of memory cells and extended to and connected with the sense amplifying unit, and a data line precharger configured to precharge the data line pair with a predetermined precharge voltage and comprise at least two precharge units which are located on and connected with the data line pair.

DETAILED DESCRIPTION OF THE EMBODIMENTS

Figure 1:
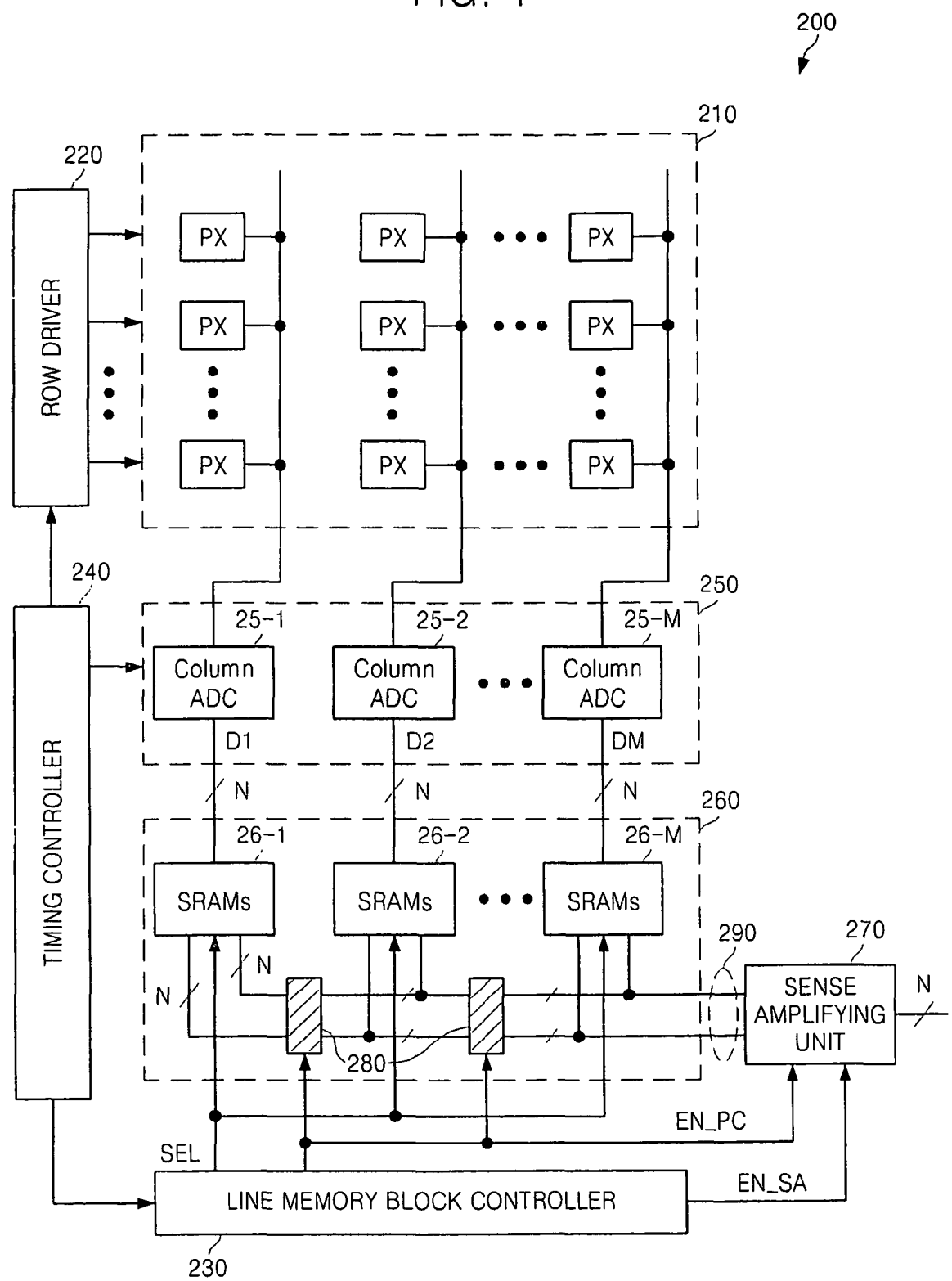
FIG. 1 is a block diagram of an image sensor according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image sensor 200 according to some embodiments of the present invention. The image sensor 200 includes a pixel array 210, a row driver 220, a timing controller 240, an analog-to-digital converter (ADC) 250, a line memory block 260, a line memory block controller 230, and a sense amplifying unit 270.

The pixel array 210 includes a plurality of pixels arranged in a matrix. Each of the pixels outputs an analog signal corresponding to an amount of incoming light that impinges upon a photo sensitive device within the pixel. In some embodiments, the photo sensitive device can be a photodiode. The row driver 220 drives pixels included in a row in the pixel array 210, which is selected by a row address output from the timing controller 240. It will be understood that the term "pixel" used in conjunction with the array 210 refers to circuits that convert incoming light to an electrical signal.

The ADC 250 converts an analog signal provided by each of the selected lines output from the pixel array 210 into an N-bit (where N is 2 or a natural number greater than 2, e.g., 10) digital signal D1, D2, or DM in response to a control signal output from the timing controller 240. In some embodiments according to the present invention, the number of pixels in a single row is equal to M, where M is equal to 2 or a natural number greater than 2. In this case, the ADC 250 may include M column ADC units 25-1 through 25-M. For instance, each of the column ADC units 25-1 through 25-M may compare an analog signal output from a corresponding pixel among M pixels in a selected row with a ramp signal and output an N-bit digital signal D1, D2, or DM corresponding to the analog signal. Accordingly, M digital signals D1 through DM each including N bits may be simultaneously output from the ADC 250.

The line memory block 260 temporarily stores the digital signals D1 through DM output from the ADC 250 organized into lines. The line memory block 260 includes a plurality of memory devices 26-1 through 26-M, a data bus 290 for transmitting data from the memory devices 26-1 through 26-M to the sense amplifying unit 270, and a data line precharger 280.

Each of the memory devices 26-1 through 26-M may be a static random access memory (SRAM) that outputs a digital signal corresponding to a column in the selected row to the data bus 290 in response to a selection signal SEL output from the line memory block controller 230. The data bus 290 includes N data line pairs 291a and 291b, 292a and 292b, and 29Na and 29Nb (FIG. 2) to transmit the digital signals output from the memory devices 26-1 through 26-M to the sense amplifying unit 270. The data line precharger 280 may precharge the N data line pairs 291a and 291b, 292a and 292b, and 29Na and 29Nb to a predetermined precharge voltage in response to a precharge enable signal EN_PC.

The line memory block controller 230 outputs the selection signal SEL, the precharge enable signal EN_PC, and a sense amplification enable signal EN_SA based on a column address and a control signal, which are output from the timing controller 240, to control the line memory block 260 and the sense amplifying unit 270.

Figure 2:
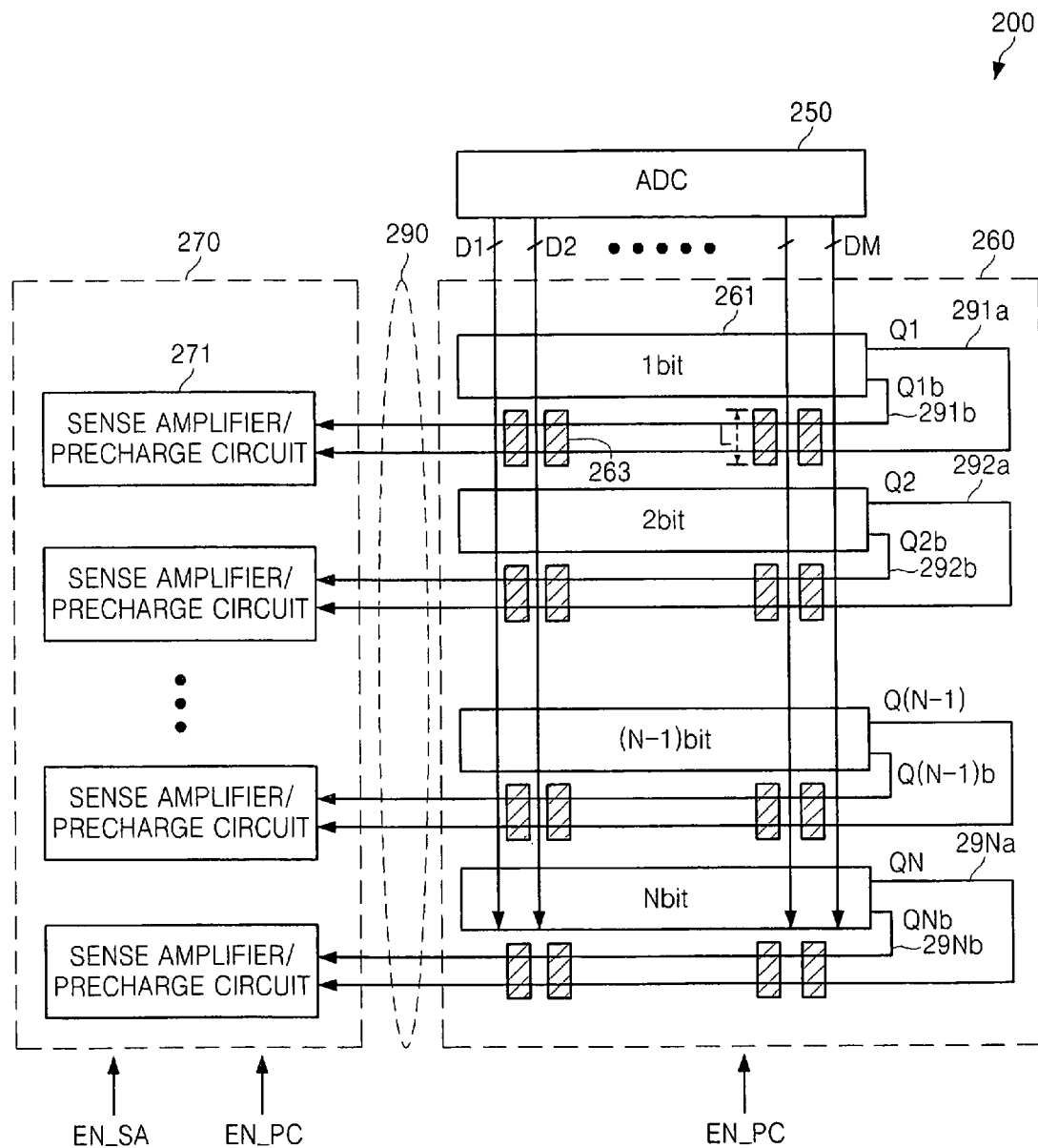
FIG. 2 is a block diagram of a line memory block according to some embodiments of the present invention.
Figure 3:
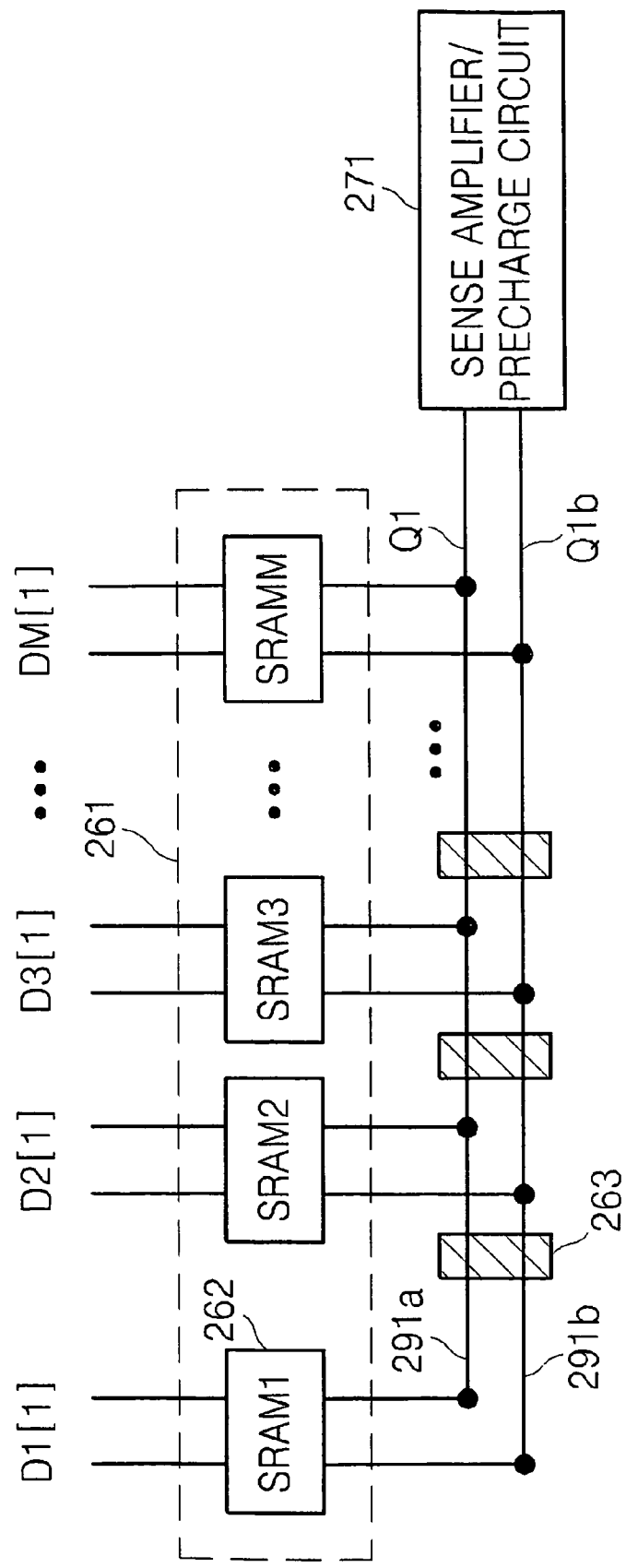
FIG. 3 is a block diagram illustrating the relationship among a line memory, a data line pair, and a plurality of precharge units illustrated in FIG. 2.

FIG. 2 is a block diagram of the line memory block 260 according to some embodiments of the present invention. FIG. 3 is a block diagram illustrating the relationship among a line memory 261, the data line pair 291a and 291b, and a plurality of precharge units 263 illustrated in FIG. 2.

Referring to FIGS. 1 through 3, the ADC 250 outputs the first through M-th N-bit digital signals D1 through DM respectively corresponding to first through M-th pixels in an addressed row of the line memory block 260. The line memory block 260 receives and stores the first through M-th digital signals D1 through DM. The line memory block 260 includes first through N-th line memories 261, the first through N-th data line pairs 291a and 291b through 29Na and 29Nb, and the data line precharger 280 including a plurality of precharge units 263. Each one of the first through N-th line memories 261, each one of the first through N-th data line pairs 291a and 291b through 29Na and 29Nb, and each one of the precharge units 263 is analogous in structure to those same types of circuits used to implement circuits in the line memory block 260 that are associated with other columns of data provided by the ADC 250. Thus, the same or similar reference numerals are used among the operating groups.

Each of the first through N-th line memories 261 may include a plurality of separate memory cells (not shown) where each is configured to store a corresponding 1-bit signal corresponding to a digital signal among the first through M-th digital signals D1 through DM.

Referring to FIG. 3, the first line memory 261 may include first through M-th memory cells SRAM 1 through SRAM M. The first through M-th memory cells SRAM 1 through SRAM M may respectively store a first bit of each of the signals D1[1] through DM[1] of the respective first through M-th digital signals D1 through DM. Accordingly, each of the first through N-th line memories 261 may store M 1-bit signals where one bit is one of first through N-th bits in each of the first through M-th digital signals D1 through DM. For instance, the first bit signals D1[1] through DM[1] of the first through M-th digital signals D1 through DM may be stored in the first line memory 261 and second bit signals (not shown) of the first through M-th digital signals D1 through DM may be stored in the second line memory 261. When the first through N-th line memories 261 are divided in columns, the columns respectively correspond to reference numerals 26-1 through 26-M illustrated in FIG. 1.

Each of the first through M-th memory cells SRAM 1 through SRAM M outputs bit signals Q1 and Q1b stored therein to a corresponding data line pair (e.g., 291a and 291b) in response to the selection signal SEL from the line memory block controller 230. In some embodiments according to the present invention, signals input to and output from the memory cells SRAM 1 through SRAM M are substantially a bit signal and its complementary signal, but for clarity of the description they are sometimes referred to herein as bit signals. The first through N-th line memories 261 may be implemented by an SRAM, but embodiments according to the present invention are not restricted thereto.

The line memory block controller 230 selects a column of the first through N-th line memories 261, from which a digital signal is output. Each of the first through N-th line memories 261 outputs a bit signal Qx and Qxb (where x=1, 2, . . . , or N) corresponding to the selected column to the sense amplifying unit 270 through a corresponding data line pair among the first through N-th data line pairs 291a and 291b through 29Na and 29Nb. The first through N-th data line pairs 291a and 291b through 29Na and 29Nb respectively connect the first through N-th line memories 261 to sense amplifier/precharge circuits 271 in the sense amplifying unit 270.

Referring to FIG. 2, each of the first through N-th data line pairs 291a and 291b through 29Na and 29Nb is disposed adjacent to a corresponding line memory among the first through N-th line memories 261. For instance, each of (N-1) data line pairs among the first through N-th data line pairs 291a and 291b through 29Na and 29Nb may be disposed between immediately adjacent ones of two of the line memories among the first through N-th line memories 261. For example, the first data line pair 291a and 291b may be disposed between the first line memory and the second line memory and the second data line pair 292a and 292b may be disposed between the second line memory and the third line memory. Here, at least two elements may be disposed on the same plane or not. In other words, embodiments according to the present invention are not restricted to disposing at least two elements on the same plane.

The data line precharger 280 includes at least two precharge units 263 to precharge each corresponding one of the first through N-th data line pairs 291a and 291b through 29Na and 29Nb with a predetermined precharge voltage in response to the precharge enable signal EN_PC. Referring to FIG. 2, a group of the precharge units 263 that are connected to and are configured to precharge the first data line pair 291a and 291b with the precharge voltage (e.g., VDD) may be referred to as a first data line precharger and the precharge units 263 in the group may be scattered on the first data line pair 291a and 291b at predetermined intervals. However, the intervals between adjacent precharge units 263 may not be the same. The number and the positions of the precharge units 263 may vary.

Figure 4:
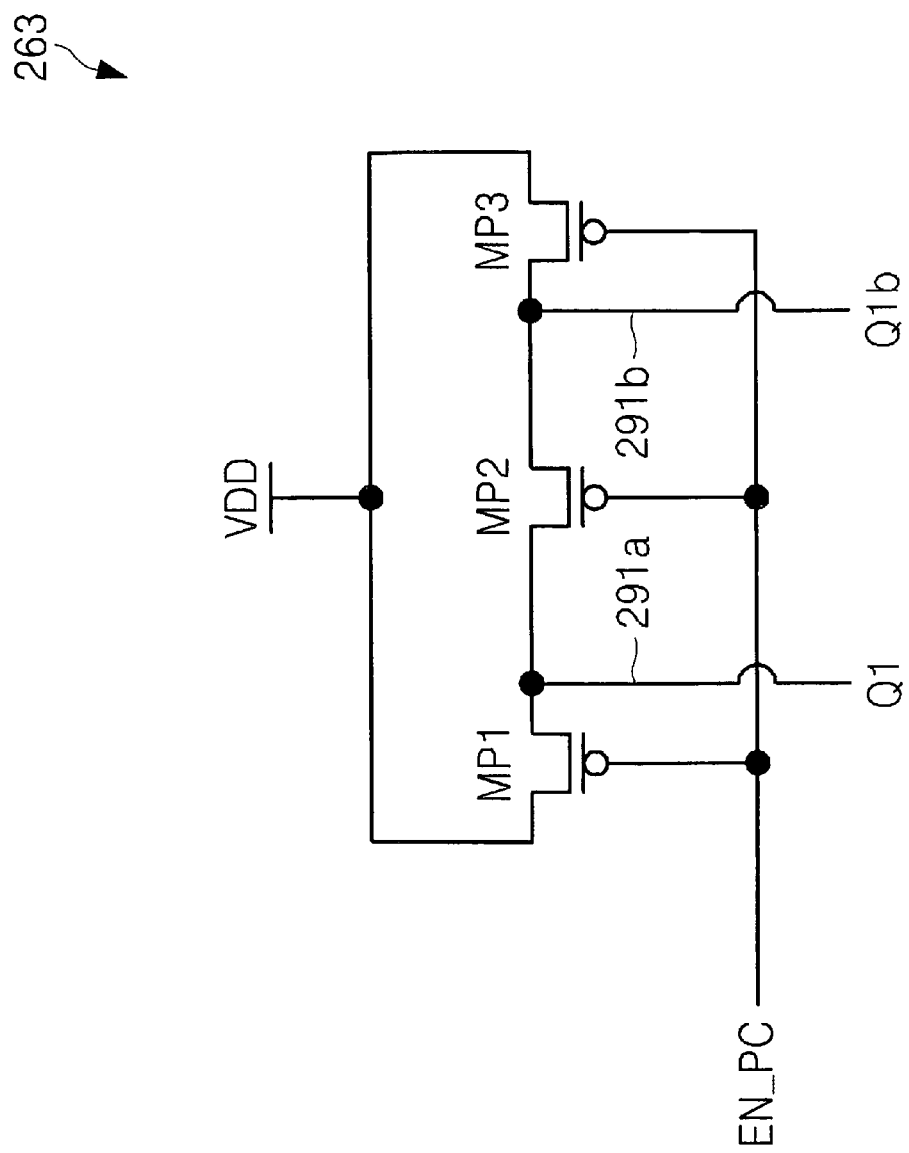
FIG. 4 is a circuit diagram of a precharge circuit illustrated in FIG. 2.

FIG. 4 is a circuit diagram of a precharge unit 263 illustrated in FIG. 3 in some embodiments according to the present invention. Referring to FIG. 4, the precharge unit 263 is connected between the data line pair 291a and 291b and a line VDD for supplying the precharge voltage. The precharge unit 263 is configured to precharge the data line pair 291a and 291b with the precharge voltage (e.g., VDD) in response to the precharge enable signal EN_PC. For this operation, the precharge unit 263 may include a plurality of (transistor) switches MP1, MP2, and MP3. The switch MP1 is connected between one of the data line pair 291a and the line VDD, the switch MP3 is connected between the other of the data line pair 291b and the line VDD, and the switch MP2 is connected between the data line pair 291a and 291b. The switches MP1, MP2, and MP3 operate in response to the precharge enable signal EN_PC for supplying the data line pair 291a and 291b with the precharge voltage. The precharge enable signal EN_PC may be output from the line memory block controller 230. The switches MP1, MP2, and MP3 may be implemented by P-channel metal-oxide semiconductor (PMOS) transistors which operate in response to the precharge enable signal EN_PC, but embodiments according to the present invention are not restricted thereto. Also, the precharge unit 263 is not restricted to the structure illustrated in FIG. 4.

The sense amplifying unit 270 may include a plurality of the sense amplifier/precharge circuits 271 respectively connected with the first through N-th data line pairs 291a and 291b through 29Na and 29Nb. Each of the sense amplifier/precharge circuits 271 senses and amplifies a voltage difference between two lines in a corresponding data line pair among the first through N-th data line pairs 291a and 291b through 29Na and 29Nb.

Figure 5:
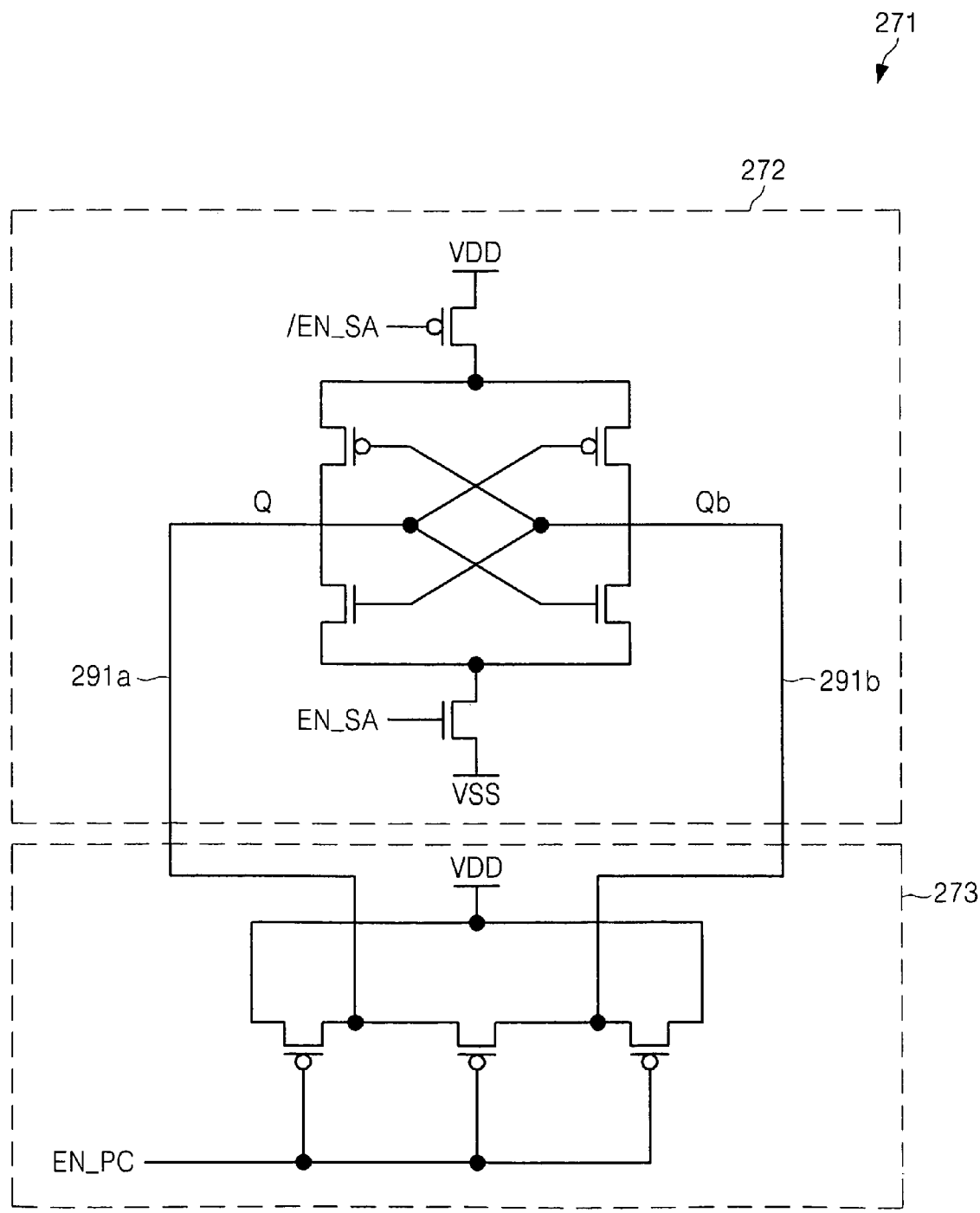
FIG. 5 is a circuit diagram of a sense amplifier/precharge circuit illustrated in FIG. 2.

FIG. 5 is a circuit diagram of one of the sense amplifier/precharge circuits 271 illustrated in FIG. 2. Referring to FIG. 5, the sense amplifier/precharge circuit 271 includes a sense amplifier 272 and a precharge circuit 273. The sense amplifier 272 may be implemented by a cross-coupled latch operating in response to the sense amplification enable signal EN_SA and senses and amplifies a voltage difference between two lines, e.g., 291a and 291b in the data line pair. The precharge circuit 273 is provided to precharge, for example, the data line pair 291a and 291b with the predetermined precharge voltage VDD in response to the precharge enable signal EN_PC and may have the same structure as the precharge unit 263 illustrated in FIG. 4. The sense amplification enable signal EN_SA and the precharge enable signal EN_PC may be output from the line memory block controller 230.

The data line pair 291a and 291b may not be satisfactorily precharged in short time only with the operation of the sense amplifier/precharge circuit 271. In particular, in the data line pair 291a and 291b which extends from an M-th memory cell to the sense amplifier/precharge circuit 271, a part (e.g., at the M-th memory cell) far from the sense amplifier/precharge circuits 271 may have slower response speed than other parts when only the sense amplifier/precharge circuit 271 is used for precharge. According to the embodiments of the present invention, the precharge units 263 are connected with the data line pair 291a and 291b to precharge the data line pair 291a and 291b together with the sense amplifier/precharge circuit 271, thereby reducing negative effects of parasitic resistance and capacitance associated with the data line pair 291a and 291b, so that a speed of precharging the data line pair 291a and 291b can be improved. As a result, an improvement in digital signal readout speed may be achieved despite the parasitic resistance and capacitance associated with the data line pair 291a and 291b. The structures and the operations of the other precharge units 263 respectively connected with the other data line pairs 292a and 292b through 29Na and 29Nb are the same as those described above. Thus, detailed descriptions thereof will be omitted.

Referring to FIG. 2, each of the precharge units 263 may be formed to have a predetermined length L and a predetermined width below a corresponding data line pair (e.g., 291a and 291b). At this time, the precharge units 263 may be aligned in a column direction. For instance, N precharge units, i.e., a precharge unit for the first data line pair 291a and 291b, a precharge unit for the second data line pair 292a and 292b, and a precharge unit for the N-th data line pair 29Na and 29Nb may be aligned with a single column line and other N precharge units may be aligned with another column line.

Figure 6:
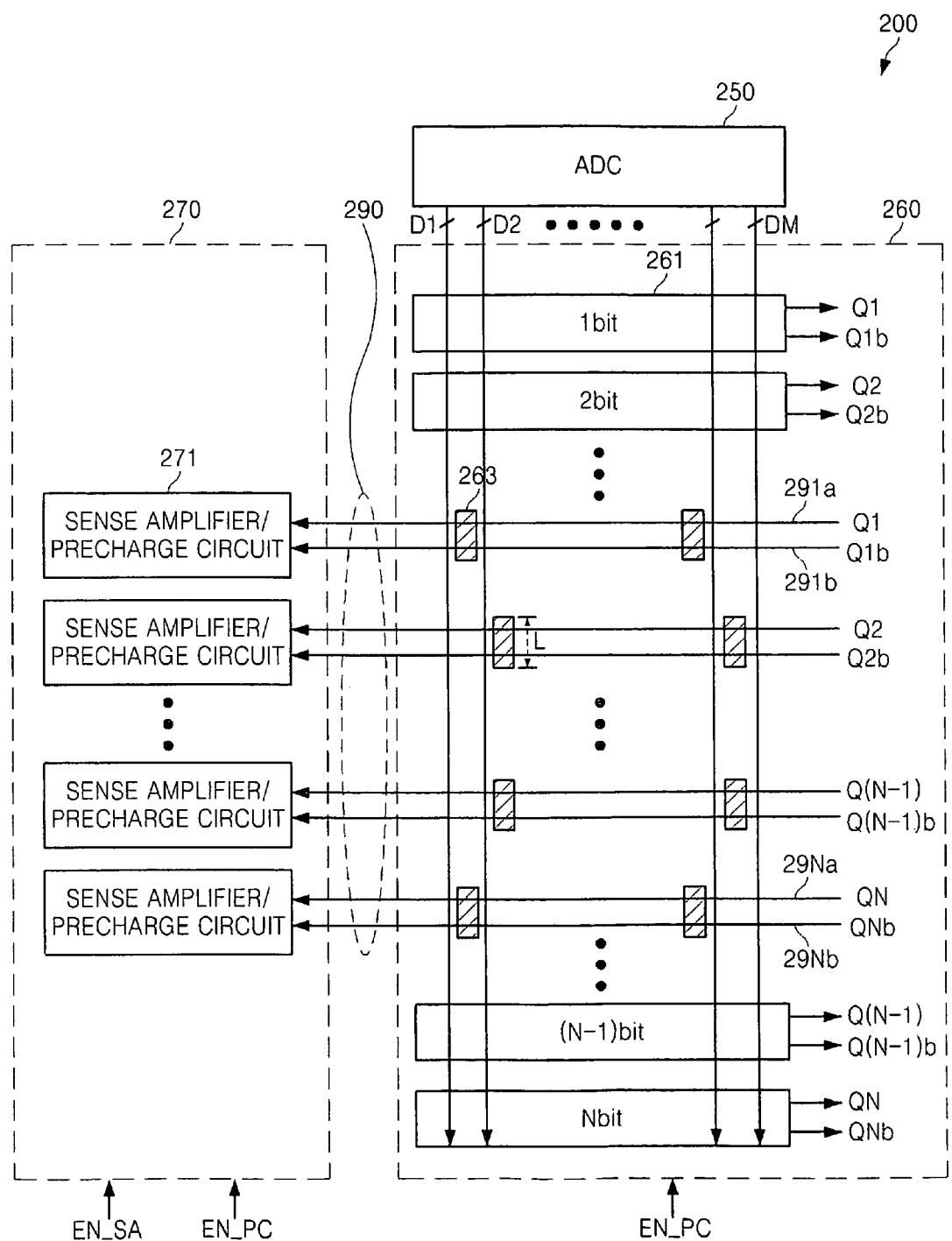
FIG. 6 is a block diagram of a line memory block according to some embodiments of the present invention.

FIG. 6 is a block diagram of the line memory block 260 according to other embodiments of the present invention. The image sensors 200 illustrated in FIGS. 2 and 6 are different from each other only in the arrangement of data line pairs and precharge units. Thus, descriptions of other elements will be omitted.

Referring to FIG. 6, the first through N-th data line pairs 291a and 291b through 29Na and 29Nb are disposed between a group of some of the first through N-th line memories 261 and another group of the others thereof. For instance, the first through N-th data line pairs 291a and 291b through 29Na and 29Nb may be disposed in the middle of a group of the first through N-th line memories 261 and each precharge unit 263 may be formed to have the predetermined length L and the predetermined width below a corresponding data line pair, for example, 291a and 291b. The precharge units 263 may be arranged as in the embodiments illustrated in FIG. 2 such that N precharge units 263 are aligned with a corresponding column line.

Alternatively, the precharge units 263 may be arranged as illustrated in FIG. 6 such that only a number of precharge units 263 less than N, for example, only two precharge units 263, are aligned with a single column line. For instance, a precharge unit for the first data line pair 291a and 291b and a precharge unit for the N-th data line pair 29Na and 29Nb are aligned with one column line and a precharge unit for the second data line pair 292a and 292b and a precharge unit for the (N-1)-th data line pair 29(N-1)a and 29(N-1)b are aligned with another column line. In other words, precharge units respectively for adjacent data line pairs are arranged in an oblique direction, so that any adverse impact that may be caused by the length L of each precharge unit 263 may be reduced. Accordingly, as compared to the embodiments illustrated in FIG. 2, an area needed to arrange data line pairs and precharge units may be reduced in the embodiments illustrated in FIG. 6. In addition, since a data bus is centered, the image sensor 200 illustrated in FIG. 6 may provide an improved layout.

Figure 7:
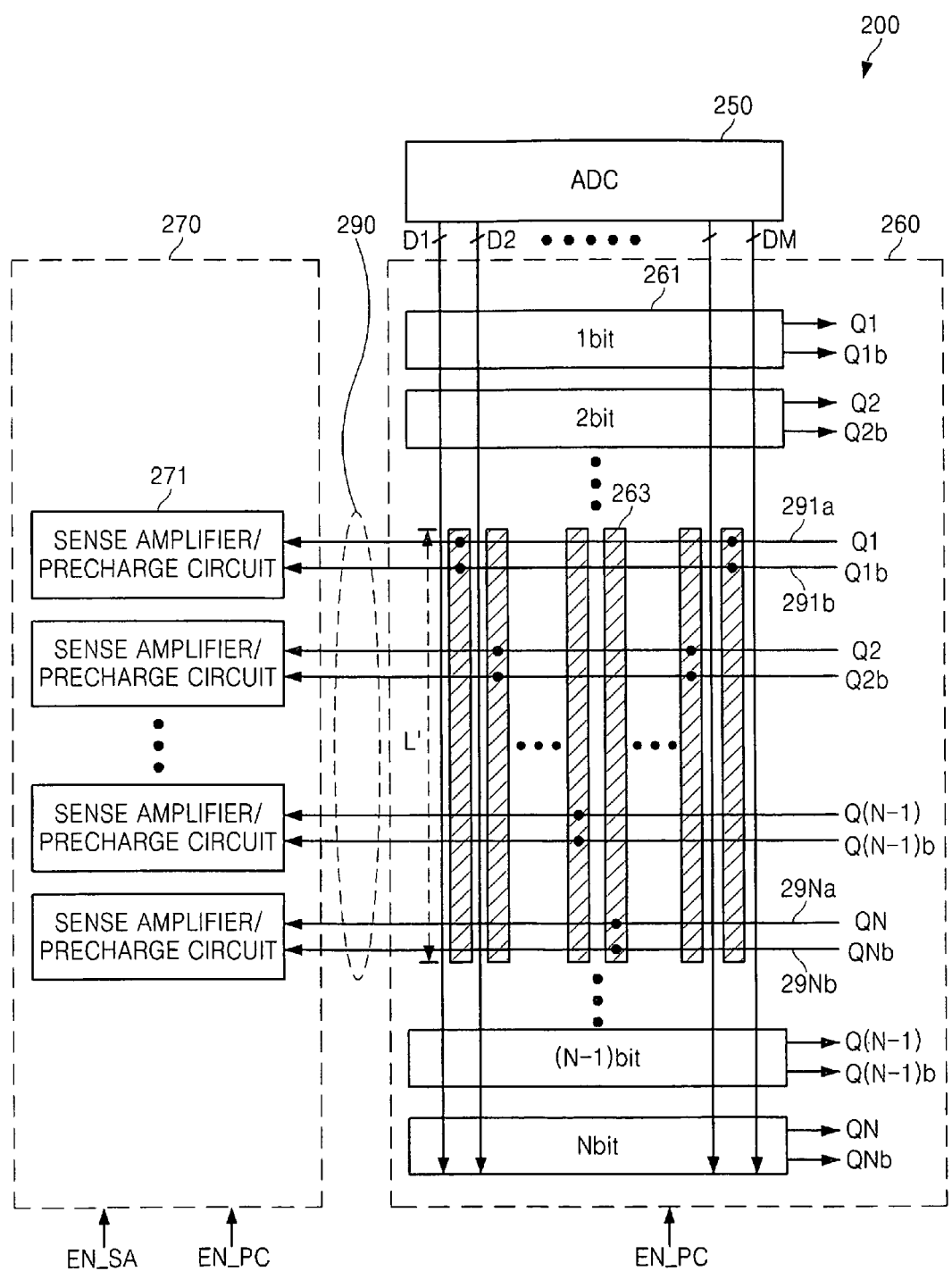
FIG. 7 is a block diagram of a line memory block according to some embodiments of the present invention.

FIG. 7 is a block diagram of the line memory block 260 according to further embodiments of the present invention. The image sensor 200 illustrated in FIG. 7 is different from the image sensor 200 illustrated in FIG. 6 only in the arrangement and the length L' of the precharge units 263. Thus, descriptions of other elements will be omitted.

As in the embodiments illustrated in FIG. 6, the first through N-th data line pairs 291a and 291b through 29Na and 29Nb are concentratively disposed between a group of some of the first through N-th line memories 261 and another group of the others thereof in the embodiments illustrated FIG. 7. However, each of the precharge units 263 is not just disposed below a corresponding data line pair among the data line pairs 291a and 291b through 29Na and 29Nb but is disposed below across the whole data bus 290. For instance, only single precharge unit 263 may be formed on a single column line. In detail, a precharge unit 263 for the first data line pair 291a and 291b is disposed on a first column line below the data bus 290, a precharge unit 263 for the second data line pair 292a and 292b is disposed on a second column line adjacent to the first column line below the data bus 290, and other precharge units 263 are sequentially disposed on respective column lines below the data bus 290. The length L' of the precharge units 263 may be determined based on the line width of the first through N-th data line pairs 291a and 291b through 29Na and 29Nb and a gap therebetween.

Referring to FIGS. 2 and 6, a predetermined area needs to be allocated to the precharge units 263 for each data line pair. Accordingly, efficiency may decrease in terms of an area. However, when the precharge units 263 have the shape and the arrangement illustrated in FIG. 7, it is not necessary to form the precharge units 263 to be restricted to each data line pair, and therefore, the image sensor 200 illustrated in FIG. 7 may be more efficient in terms of an area than image sensors 200 illustrated in FIGS. 2 and 6. Even if an area allocated to the line memory block 260 is limited during the design of the image sensor 200 illustrated in FIG. 7, it would be easier to adjust the number of the precharge units 263 according to the allocated area.

The arrangement of line memories, data line pairs, and precharge units has been described in three different types of embodiments, but the arrangement may be changed variously. For instance, the arrangement may vary with the number of precharge units connected with each data line pair or an area allocated to the precharge units.

In some embodiments according to the present invention, data line pairs can be precharged using a plurality of (e.g., at least two) precharge units connected with each data line pair, where the precharge unit can include a precharge circuit for each of a pair of data lines. As a result, the digital signal readout speed of the device can be improved despite the parasitic resistance and capacitance of the data line pair. In addition, data errors may otherwise be induced due to the parasitic resistance and capacitance of the data line pair by delaying output of a digital signal from a column before the data line pair is completely precharged. In some embodiments, the errors may be reduced because the improved precharge may reduce the delay due to the parasitic resistance and capacitance of the data line pair.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. An image sensor comprising:
a pixel array comprising a plurality of pixels each configured to output a respective analog signal corresponding to an amount of light impinging upon a respective one of the pixels;
an analog-to-digital converter configured to convert analog signals output from a row of the pixel array in units of lines into an N-bit digital signal where N is 2 or a natural number greater than 2;
a line memory block configured to temporarily store the N bit digital signal in unit of lines; and
a sense amplifying unit configured to sense and amplify an N bit signal output from the line memory block, wherein the line memory block comprises:
first through N-th line memories each comprising a plurality of memory cells each of which stores a corresponding 1 bit signal of the N bit digital signal of a corresponding pixel among the plurality of pixels;

first through N-th data line pairs configured to respectively connect the first through N-th line memories to the sense amplifying unit; and first through N-th data line prechargers each comprising at least two precharge units separately connected with a corresponding one of the first through N-th data line pairs to precharge the corresponding data line pair with a predetermined precharge voltage.

2. The image sensor of claim 1, wherein each of the first through N-th data line pairs is disposed between a corresponding one of the first through N-th line memories and another one thereof.

3. The image sensor of claim 1, wherein the first through N-th data line pairs are disposed between a group of some of the first through N-th line memories and a group of the others.

4. The image sensor of claim 2, wherein each of the precharge units is disposed at an allocated area below a corresponding data line pair among the first through N-th data line pairs.

5. The image sensor of claim 3, wherein each of the precharge units is disposed at an allocated area below a corresponding data line pair among the first through N-th data line pairs.

6. The image sensor of claim 4, wherein N precharge units respectively corresponding to the first through N-th data line pairs are arranged in a column direction below the respective first through N-th data line pairs.

7. The image sensor of claim 5, wherein N precharge units respectively corresponding to the first through N-th data line pairs are arranged in a column direction below the respective first through N-th data line pairs.

8. The image sensor of claim 3, wherein precharge units respectively connected with adjacent data line pairs among the first through N-th data line pairs are arranged in an oblique direction.

9. The image sensor of claim 3, wherein each of the precharge units is disposed on a single column line below the first through N-th data line pairs.

10. The image sensor of claim 9, wherein the precharge units are connected with the first through N-th data line pairs in increasing order from the first to N-th data line pairs or decreasing order from the Nth to first data line pairs so that each precharge unit is connected with the corresponding one of the first through N-th data line pairs.

11. The image sensor of claim 1, wherein each precharge unit is connected between the corresponding data line pair and a line for supplying the precharge voltage and comprises a plurality of switches operating in response to a precharge enable signal.

12. The image sensor of claim 1, further comprising:

a timing controller;

a row driver configured to selectively drive pixels in a selected row of the pixel array responsive to a row address provided by the timing controller; and a line memory block controller configured to control the line memory block according to control of the timing controller.

13. An image sensor comprising:

a pixel array comprising a plurality of pixels each configured to output a respective analog signal corresponding to an amount of light impinging upon a respective one of the pixels;

an analog-to-digital converter configured to convert analog signals output from a row of the pixel array in units of lines into an N-bit digital signal where N is 2 or a natural number greater than 2;

a line memory block configured to temporarily store the N bit digital signal in unit of lines; and a sense amplifying unit configured to sense and amplify an N bit signal output from the line memory block, wherein the line memory block comprises:

a plurality of memory cells;

a data line pair connected with the plurality of memory cells and extended to and connected with the sense amplifying unit; and a data line precharger configured to precharge the data line pair with a predetermined precharge voltage and comprising at least two precharge units which are located on and connected with the data line pair.

14. The image sensor of claim 13, wherein one of the precharge units is connected with the data line pair at a side of the sense amplifying unit and the other precharge unit is connected with the data line pair at another side.

15. The image sensor of claim 14, wherein each of the precharge units is connected between the data line pair and a line for supplying the precharge voltage and precharges the data line pair with the precharge voltage in response to a precharge enable signal.

* * * * *